(12) United States Patent
Marten

(10) Patent No.: US 8,373,408 B2
(45) Date of Patent: Feb. 12, 2013

(54) HIGH PRECISION ALGORITHMICALLY ASSISTED VOLTAGE DIVIDER WITH FAULT DETECTION

(75) Inventor: Victor Marten, Flushing, NY (US)

(73) Assignee: Sendyne Corporation, New York, NY (US)

( * ) Notice: Subject to any disclaimer, the term of this patent is extended or adjusted under 35 U.S.C. 154(b) by 0 days.

(21) Appl. No.: 13/635,907

(22) PCT Filed: Feb. 22, 2012

(86) PCT No.: PCT/IB2012/050797
§ 371 (c)(1),
(2), (4) Date: Sep. 19, 2012

(87) PCT Pub. No.: WO2012/114278
PCT Pub. Date: Aug. 30, 2012

(65) Prior Publication Data
US 2013/0002234 A1    Jan. 3, 2013

Related U.S. Application Data

(60) Provisional application No. 61/445,467, filed on Feb. 22, 2011.

(51) Int. Cl.
*G01R 19/18* (2006.01)

(52) U.S. Cl. .... 324/120; 324/522; 324/433; 324/762.01

(58) Field of Classification Search ................. 324/99 D, 324/73.1, 142, 131, 115, 120, 522, 713, 72.5, 324/433, 762.01
See application file for complete search history.

(56) References Cited

U.S. PATENT DOCUMENTS

| | | | | |
|---|---|---|---|---|
| 5,469,071 A | * | 11/1995 | Obata | 324/713 |
| 5,831,427 A | * | 11/1998 | Janke | 324/140 R |
| 6,008,664 A | * | 12/1999 | Jett et al. | 324/762.02 |
| 8,305,084 B2 | * | 11/2012 | Ishikawa et al. | 324/433 |
| 2006/0087329 A1 | | 4/2006 | Iwabuchi et al. | |
| 2007/0078616 A1 | | 4/2007 | Kawamura | |
| 2008/0116879 A1 | | 5/2008 | Hsieh | |
| 2010/0225304 A1 | | 9/2010 | Wynne | |
| 2011/0031976 A1 | | 2/2011 | Ishikawa et al. | |

OTHER PUBLICATIONS

International search report mailed Sep. 12, 2012 in application No. PCT/IB2012/050797.
Written opinion mailed Sep. 12, 2012 in application No. PCT/IB2012/050797.

* cited by examiner

*Primary Examiner* — Arleen M Vazquez
(74) *Attorney, Agent, or Firm* — Oppedahl Patent Law Firm LLC

(57) ABSTRACT

A method, an algorithm, and circuits for implementation of a high-accuracy voltage divider are described that include a capability of fault detection. The disclosure allows for correction of non-catastrophic faults, such as significant changes of the components' values. The performance of the circuit built as described is vastly superior to operations achievable with the modern-day components utilized in previous standard and known configurations.

33 Claims, 3 Drawing Sheets

Exemplary circuit for current invention (a)   (b)

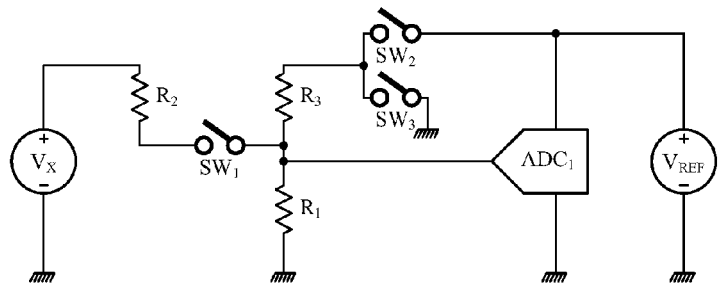

*Figure 3*     Exemplary circuit for current invention

| Step # | SW$_1$ | SW$_2$ | SW$_3$ | ADC$_1$ V$_{in}$ |
|---|---|---|---|---|
| 1 | Open | Closed | Open | $V_1 = \dfrac{R_1}{R_1 + R_3} \cdot V_{REF}$ |
| 2 | Closed | Open | Open | $V_2 = \dfrac{R_1}{R_1 + R_2} \cdot V_X$ |
| 3 | Closed | Open | Closed | $V_3 = \dfrac{R_1 \| 3}{R_1 \| 3 - R_2} \cdot V_X$ |
| 4 | Closed | Closed | Open | $V_4 = \dfrac{R_1 \| 3}{R_1 \| 3 + R_2} \cdot V_X + \dfrac{R_1 \| 2}{R_1 \| 2 + R_3} \cdot V_{REF}$ |
| $R_1\|3 = \dfrac{R_1 \cdot R_3}{R_1 + R_3}$ (for Steps 3 and 4);    $R_1\|2 = \dfrac{R_1 \cdot R_2}{R_1 - R_2}$ (for Step 4) ||||||

(a)

(b)    $V_X = V_2 \cdot \left\{ 1 + \dfrac{(1 - \frac{V_1}{V_{REF}}) \cdot (V_4 - V_3)}{(V_1 + V_3 - V_4)} \right\}$ (c)    $V_X = V_2 \cdot \left\{ 1 + \dfrac{V_4 - V_3}{2 \cdot (V_1 + V_3 - V_4)} \right\}$     (when $R_1 = R_3$)

*Figure 4*    Method and algorithm (a), formula for calculation of V$_X$ (b), and simplified formula (c).

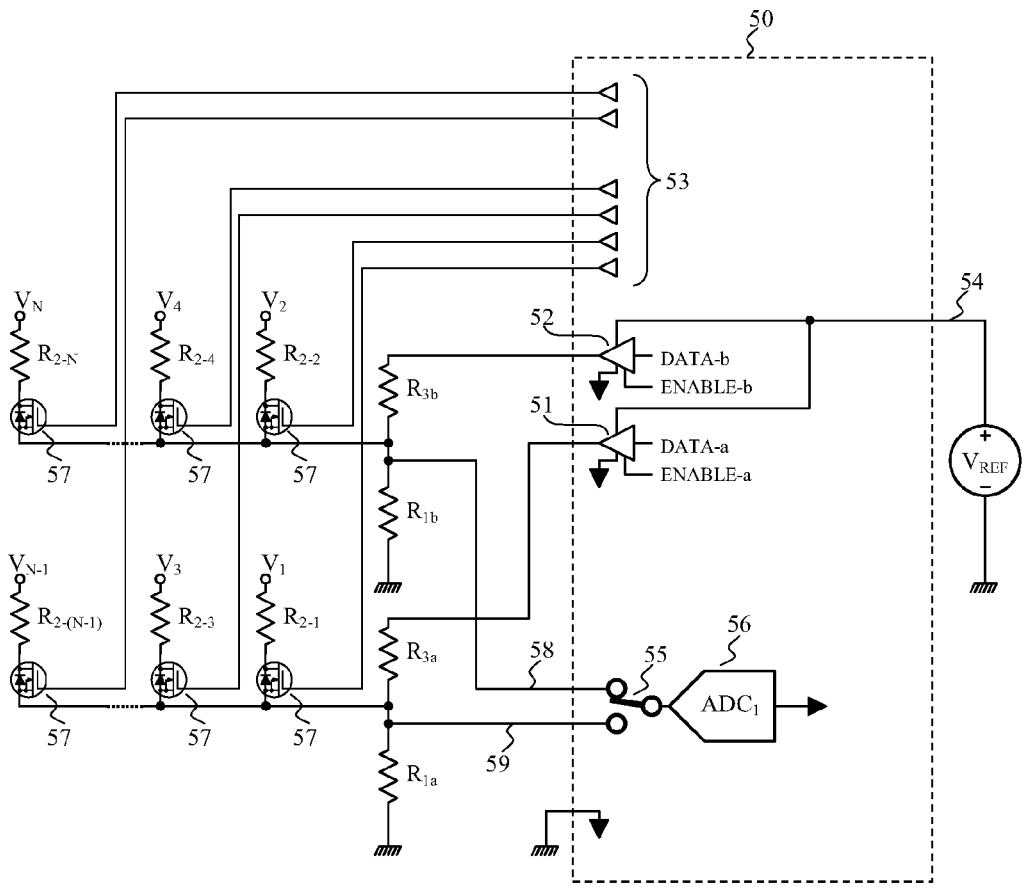
Figure 5    Multiple-input Instrumentation Amplifier according to current invention
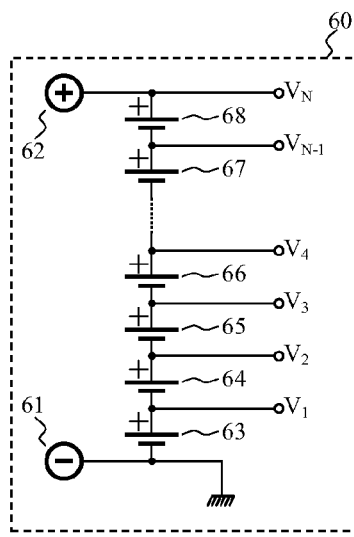
Figure 6    Battery made up from series-connected cells

HIGH PRECISION ALGORITHMICALLY ASSISTED VOLTAGE DIVIDER WITH FAULT DETECTION

BACKGROUND

Figure 1:
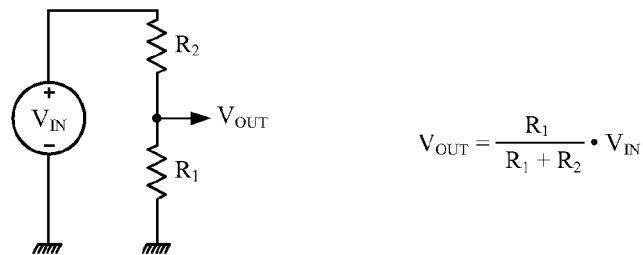

One of the commonly utilized circuits in any electronic device is a voltage divider shown in FIG. 1. An input voltage $V_{IN}$ can be scaled according to the ratio of resistors $R_1$ and $R_2$; one is able to calculate the output voltage of the divider by well-known formula in FIG. 1.

Figure 2:
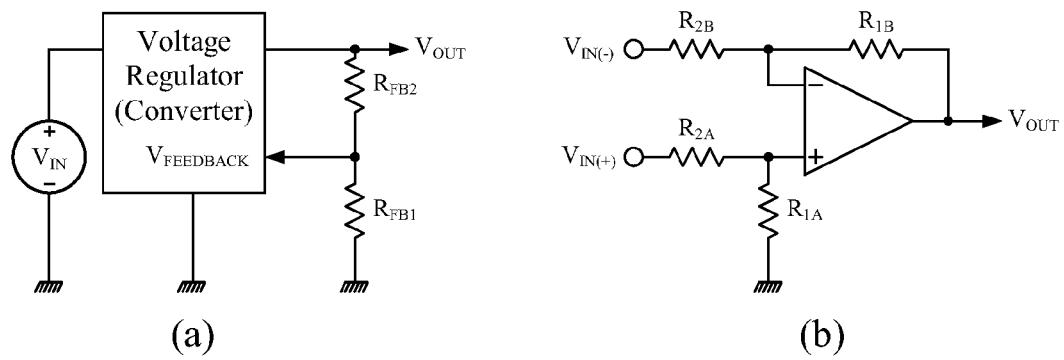

Two familiar applications for the voltage divider are depicted in FIG. 2.

Shown in (a) is the typical circuit for the voltage regulator; the voltage divider consisting of $R_{FB1}$ and $R_{FB2}$ generates a feedback voltage $V_{FEEDBACK}$ that is used to regulate the output voltage $V_{OUT}$. The alert reader will immediately recognize that any faults within the voltage divider will produce an abnormal output voltage from the regulator; this may lead to destruction of the whole device that incorporates this voltage regulator, as well as to smoke and fire.

For example, if resistor $R_{FB2}$ is opened (due to overheating, failure of the solder, or any other reason), the voltage regulator circuit will assume that the output is low, near 0 V, and will try to increase it uncontrollably.

Therefore, it is typical that any circuit that may produce dangerous output in case of the divider fault includes some redundancy or an independent control mechanism to limit the maximum output. A characteristic solution for the voltage regulator is to utilize two voltage dividers, with the circuit inside of the voltage regulator being able to select the highest feedback voltage, and thus limit the output; alternatively, a separate over-voltage protection circuit is employed.

Illustrated in FIG. 2 (b) is a so-called Instrumentation Amplifier (IA), a circuit that is able to produce at the output an amplified difference between the two input signals.

An important characteristic of the IA is the Common Mode Rejection Ratio (CMRR), an ability to reject changes in input voltages that are common to both inputs, while the difference between the inputs gets amplified and goes though unimpeded.

With the common-day state-of-the-art components it is possible to create an IA circuit of this configuration that boasts a CMRR value of, perhaps, 20-48 dB (utilizing the 0.1% accurate resistors, that are the best available for practical use). Any further improvement of CMRR is achieved by manually trimming the value of one or several resistors.

However, even a perfectly adjusted IA will tend to lose the CMRR value when operated over some temperature range, and specifically when operated at a temperature other than at the temperature at which the adjustments were made. This is due to resistors having various temperatures and/or various temperature coefficients. It will be appreciated that the best possible practical performance for this type of the circuit is on the order of 1% or worse. It is only with strict laboratory conditions and very expensive high-accuracy resistors that better performance is achievable.

On the other hand, the IA constructed according to FIG. 2 (b) is able safely to sense voltages that are many times higher than the supply voltage of the Operational Amplifier, which is a very desirable property.

In a typical system, it is likely that an Analog-to-digital converter will follow the IA, and the IA output will thus be converted to a digital value. Also it is likely that in a modern-day system a microcontroller will make sense of and act upon the values received from the IA.

Furthermore, present-day analog-to-digital converters can have an accuracy and resolution that is many times better than the best-possible performance available from the IA circuit in FIG. 2 (b).

DESCRIPTIONS OF THE DRAWINGS

This invention will be described with respect to several drawings, of which:

FIGS. 1 and 2 depict prior-art circuits,

FIG. 3 presents an exemplary circuit making use of the invention;

FIG. 4 describes a method and algorithm, and shows formulas for calculations;

FIG. 5 demonstrates a multiple-input Instrumentation Amplifier created according to the invention; and FIG. 6 illustrates a battery created with series-connected cells; the circuit in FIG. 5 is superbly suitable for measurements of all the voltages in such a battery.

DETAILED DESCRIPTION

The current invention teaches a method, an algorithm, and circuits for implementation of a high-accuracy voltage divider that includes a capability of fault detection.

Presented in FIG. 3 is the exemplary circuit for the current invention. In addition to $R_1$ and $R_2$ that were part of the original circuit for the voltage divider of FIG. 1, there are several components (resistors and switches) that make possible the new properties of high accuracy and fault detection.

Also present is the Analog-to-digital converter that is typically a part of any contemporary electronic device; the closing and opening of the switches would most likely be governed by a microcontroller that is also a typical part of modern-day devices.

If several measurements are performed according to an algorithm described in FIG. 4(a), an unknown voltage $V_x$ can be calculated from the formula presented in FIG. 4(b). As will be appreciated, the calculated value of the unknown voltage $V_x$ is independent of the values of the resistors.

In other words, if one or all resistors changed their values (due to temperature, ageing, mechanical stress, or any other effects), the calculated value of the unknown voltage $V_x$ would still be accurate.

Using similar formulas (not shown for clarity, but readily derivable by the alert reader), the individual values for all resistors and/or ratios between the resistors can be calculated; deviations in excess of preset limits will be promptly recognized by a microcontroller, and can be reported as a detected fault.

In addition, such deviations will prompt the microcontroller to behave in a specific way that will place the system in a known and safe state. Such behavior may include (but is not limited to) shutting down the supply voltages, disconnecting the loads, and preventing the human operator from using a faulty device.

A special case that allows for simplification of the formula is shown in FIG. 4 (c); a necessary condition for this simplification is that $R_1 = R_3$. However, the system may still periodically check that condition $R_1 = R_3$ is in fact precise to the desired accuracy.

Describing individual steps within the algorithm of FIG. 4 (a):

In Step #1 switch $SW_2$ is closed and measurement $V_1$ is obtained (as a digitally coded result from $ADC_1$); the expected value is shown under heading "$ADC_1\ V_{in}$" in the table FIG. 4(a).

In Step #2 switch $SW_1$ is closed and measurement $V_2$ is obtained.

In Step #3 switches $SW_1$ and $SW_3$ are closed and measurement $V_3$ is obtained.

And finally, in Step #4 switches $SW_1$ and $SW_2$ are closed and measurement $V_4$ is obtained.

Substituting the above measured values into formula FIG. 4 (b) or (c), one can find the unknown value $V_x$.

The exact order of the above four (4) steps is not important, they may in fact be executed in whatever sequence is conducive to and coherent with other system processes.

The accuracy of the calculated voltage $V_x$ depends only on the accuracy of the Analog-to-digital converter. As described above, the typical A/D unit in a modern device is routinely many times more accurate than the accuracy of an unaided resistive voltage divider.

Described in FIG. 5 is a multiple-input (e.g. multiplexed) Instrumentation Amplifier that utilizes voltage dividers according to the invention.

An alert reader will recognize that the circuit in FIG. 5 includes two independent voltage divider channels, each similar to the depiction in FIG. 3.

A microcontroller 50 has internal circuits 51, 52, 55, and 56.

Circuits 51 and 52 are ports typically used for digital input/output, but utilized here instead of switches $SW_2$ and $SW_3$ of FIG. 3, with exactly the same functionality.

Circuit 56, with the aid of circuit 55, corresponds to an Analog-to-digital converter with multiplexed input; alternatively, and with better performance, a microcontroller with dual on-board A/D converters can be used.

Alternatively, circuit 55 could be eliminated and nodes 58 and 59 combined, thus permitting the elimination of some other system elements such as driver 52 and resistors $R_{3b}$ and $R_{1b}$.

Digital drivers 53 control the voltage on the gates of n-channel MOSFET switches 57; only one MOSFET switch connected to $R_{1a}/R_{3a}$ and one MOSFET switch connected to $R_{1b}/R_{3b}$ should be activated (turned On) at the same time.

It will be appreciated that the gate voltage on the MOSFET switch should be sufficiently large in relation to the voltage on lines 58 and 59, in order to fully enhance (turn On) the corresponding switch.

When the MOSFET switch is fully turned On, it still has some residual resistance; however, the action of the algorithm will accommodate this additional resistance, as it will simply manifest itself as slight increase of corresponding resistors $R_{2-n}$; as described above, the algorithm is not sensitive to the actual value of all resistors.

It will likewise be appreciated that there are obvious limitations, namely, the normal operating input range of the A/D converter 56 should not be violated as the result of the resistance changes.

The configuration of FIG. 5 is suited for measurements of voltages that are positive in respect to ground; obvious steps can be taken in order to make this circuit operational with negative voltages as well as with voltages that are both positive and negative in respect to ground; such steps may include utilization of p-channel MOSFETs, or pairs of n-channel or p-channel MOSFETs in order to make all switches bi-directional-blocking After the two unknown voltages are calculated (one in each channel of measurements), the difference between the two voltages is obtained digitally, inside microcontroller 50. Then, the difference voltage can be used in the same manner as if it had been obtained from an actual old-configuration IA of FIG. 2(b).

FIG. 6 shows one system that is well suited for measurements with the circuit in FIG. 5. A battery 60 is created by serially connecting cells 63 through 68. As a part of the control system for such a battery, it will be necessary to measure voltages $V_1$ through $V_N$. A circuit such as in FIG. 5 is ideally suited for the job.

It is noted that the examples given above refer to a "ground" and to a $V_{REF}$ that is positive relative to ground. Such designations are, of course, completely arbitrary and are employed merely for economy of description. Every circuit portrayed here could be just as well set up with opposite sense, for example with $V_{REF}$ being negative relative to ground.

The alert reader, having learned the teachings given herein, will have no difficulty devising myriad obvious improvements and variants of the invention, all of which are intended to be encompassed within the scope of the claims below.

The invention claimed is:

1. Apparatus for measuring a voltage at a terminal, the apparatus comprising:
    an analog to digital A/D converter having an analog input and a digital output, the A/D converter measuring its input relative to a reference voltage VREF and to a ground;
    a first resistance connected between the analog input of the A/D converter and the ground;
    a first switch controllably connecting the analog input of the A/D converter through a second resistance to the terminal;
    a third resistance connected between the analog input of the A/D converter and a first node;
    a second switch controllably connecting the first node to the VREF;
    a third switch controllably connecting the first node to the ground.

2. The apparatus of claim 1 in which the first resistance is substantially equal in resistance to the third resistance.

3. The apparatus of claim 1 further comprising a control means, the control means disposed to carry out the steps of:
    closing the second switch at a time when the first switch and the third switch are open, and measuring a first voltage at the analog input of the A/D converter;
    closing the first switch at a time when the second switch and the third switch are open, and measuring a second voltage at the analog input of the A/D converter;
    closing the first switch and the third switch at a time when the second switch is open, and measuring a third voltage at the analog input of the A/D converter; and
    closing the first switch and the second switch at a time when the third switch is open, and measuring a first voltage at the analog input of the A/D converter.

4. The apparatus of claim 3 wherein the control means is further characterized in that the first, second, third, and fourth closings take place in the sequence set forth.

5. A method for use with apparatus comprising an analog to digital A/D converter having an analog input and a digital output, the A/D converter measuring its input relative to a reference voltage VREF and to a ground, the apparatus further comprising a first resistance, a second resistance, and a third resistance, the first resistance connected between the analog input of the A/D converter and the ground, the method carried out with respect to a terminal, the method comprising the steps of:
    connecting the third resistance between the analog input of the A/D converter and the VREF, and measuring a first voltage at the analog input of the A/D converter;

connecting the second resistance between the terminal and the analog input of the A/D converter, and measuring a second voltage at the analog input of the A/D converter;

connecting the second resistance between the terminal and the analog input of the A/D converter and connecting the third resistance between the analog input of the A/D converter and the ground, and measuring a third voltage at the analog input of the A/D converter; and connecting the second resistance between the terminal and the analog input of the A/D converter and connecting the third resistance between the analog input of the A/D converter and the VREF, and measuring a fourth voltage at the analog input of the A/D converter.

6. The method of claim 5 in which the first resistance is substantially equal in resistance to the third resistance.

7. The method of claim 5 wherein the first, second, third, and fourth closing steps take place in the sequence set forth.

8. The method of claim 5 further comprising the step, performed after the first, second, third, and fourth closing steps, of evaluating a function of the first, second, third, and fourth voltages to yield a measured voltage at the terminal.

9. The method of claim 5 wherein the measuring of voltage at the analog input of the A/D converter further comprises observing the voltage at several distinct times so as to evaluate whether the voltage is settled.

10. The method of claim 5 further comprising the step, performed after the first, second, third, and fourth closing steps, of evaluating a function of the first, second, third, and fourth voltages to yield a measured value for the first resistance, the second resistance, and the third resistance.

11. The method of claim 10 further comprising the step of comparing measured values for the first resistance, the second resistance, and the third resistance at various times, whereby any large change in the first resistance or the second resistance or the third resistance may be detected.

12. Apparatus for measuring a voltage at each of a plurality of terminals, the apparatus comprising:
an analog to digital A/D converter having an analog input and a digital output, the A/D converter measuring its input relative to a reference voltage VREF and to a ground;
a first resistance connected between the analog input of the A/D converter and the ground;
a plurality of first switches, each one of the first switches associated with a respective one of the plurality of terminals;
a plurality of second resistances, each one of the second resistances associated with a respective one of the plurality of terminals; each one of the first switches controllably connecting the analog input of the A/D converter to its respective terminal through the terminal's respective second resistance;
a third resistance connected between the analog input of the A/D converter and a first node;
a second switch controllably connecting the first node to the VREF;
a third switch controllably connecting the first node to the ground.

13. The apparatus of claim 12 in which the first resistance is substantially equal in resistance to the third resistance.

14. The apparatus of claim 12 further comprising a control means, the control means disposed to carry out the steps of:
closing the second switch at a time when the first switches and the third switch are open, and measuring a first voltage at the analog input of the A/D converter;

closing one of the first switches at a time when the second switch and the third switch are open, and measuring a second voltage at the analog input of the A/D converter;

closing the same one of the first switches and the third switch at a time when the second switch is open, and measuring a third voltage at the analog input of the A/D converter; and closing the same one of the first switches and the second switch at a time when the third switch is open, and measuring a first voltage at the analog input of the A/D converter.

15. The apparatus of claim 14 wherein the control means is further characterized in that the first, second, third, and fourth closings take place in the sequence set forth.

16. A method for use with respect to a plurality of terminals, the method for use with respect to apparatus comprising an analog to digital A/D converter having an analog input and a digital output, the A/D converter measuring its input relative to a reference voltage VREF and to a ground, the apparatus further comprising a first resistance, a plurality of second resistances, each of the second resistances associated with a respective one of the terminals, and a third resistance, the first resistance connected between the analog input of the A/D converter and the ground, the method comprising the steps of:
connecting the third resistance between the analog input of the A/D converter and the VREF, and measuring a first voltage at the analog input of the A/D converter;

connecting one of the second resistances between its respective terminal and the analog input of the A/D converter, and measuring a second voltage at the analog input of the A/D converter;

connecting the same one of the second resistances between its respective terminal and the analog input of the A/D converter and connecting the third resistance between the analog input of the A/D converter and the ground, and measuring a third voltage at the analog input of the A/D converter; and connecting the same one of the second resistances between its respective terminal and the analog input of the A/D converter and connecting the third resistance between the analog input of the A/D converter and the VREF, and measuring a fourth voltage at the analog input of the A/D converter.

17. The method of claim 16 in which the first resistance is substantially equal in resistance to the third resistance.

18. The method of claim 16 wherein the first, second, third, and fourth connecting steps take place in the sequence set forth.

19. The method of claim 16 further comprising the step, performed after the first, second, third, and fourth connecting steps, of evaluating a function of the first, second, third, and fourth voltages to yield a measured voltage at the respective terminal.

20. The method of claim 16 wherein the measuring of voltage at the analog input of the A/D converter further comprises observing the voltage at several distinct times so as to evaluate whether the voltage is settled.

21. The method of claim 16 further comprising the step, performed after the first, second, third, and fourth connecting steps, of evaluating a function of the first, second, third, and fourth voltages to yield a measured value for the first resistance, the one of the second resistances, and the third resistance.

22. The method of claim 21 further comprising the step of comparing measured values for the first resistance, the one of the second resistances, and the third resistance at various times, whereby any large change in the first resistance or the one of the second resistances or the third resistance may be detected.

23. Apparatus for measuring a voltage at each of a first plurality of terminals and at each of a second plurality of terminals, the apparatus comprising:

a first analog to digital A/D converter having an analog input and a digital output, the first A/D converter measuring its input relative to a reference voltage VREF and to a ground;

a second analog to digital A/D converter having an analog input and a digital output, the second A/D converter measuring its input relative to the VREF and to the ground;

a first resistance connected between the analog input of the first A/D converter and the ground;

a fourth resistance connected between the analog input of the second A/D converter and the ground;

a plurality of first switches, each one of the first switches associated with a respective one of the first plurality of terminals;

a plurality of fourth switches, each one of the fourth switches associated with a respective one of the second plurality of terminals;

a plurality of second resistances, each one of the second resistances associated with a respective one of the first plurality of terminals; a plurality of fifth resistances, each one of the fifth resistances associated with a respective one of the second plurality of terminals;

each one of the first switches controllably connecting the analog input of the first A/D converter to its respective terminal through the terminal's respective second resistance;

each one of the fourth switches controllably connecting the analog input of the second A/D converter to its respective terminal through the terminal's respective fifth resistance;

a third resistance connected between the analog input of the first A/D converter and a first node;

a sixth resistance connected between the analog input of the second A/D converter and a second node;

a second switch controllably connecting the first node to the VREF;

a fifth switch controllably connecting the second node to the VREF;

a third switch controllably connecting the first node to the ground;

a sixth switch controllably connecting the second node to the ground.

24. The apparatus of claim 23 in which the first resistance is substantially equal in resistance to the third resistance and the fourth resistance is substantially equal in resistance to the sixth resistance.

25. The apparatus of claim 23 further comprising a control means, the control means disposed to carry out the steps of:

closing the second switch at a time when the first switches and the third switch are open, and measuring a first voltage at the analog input of the first A/D converter;

closing one of the first switches at a time when the second switch and the third switch are open, and measuring a second voltage at the analog input of the first A/D converter;

closing the same one of the first switches and the third switch at a time when the second switch is open, and measuring a third voltage at the analog input of the first A/D converter;

closing the same one of the first switches and the second switch at a time when the third switch is open, and measuring a first voltage at the analog input of the first A/D converter;

closing the fifth switch at a time when the fourth switches and the sixth switch are open, and measuring a fifth voltage at the analog input of the second A/D converter;

closing one of the fourth switches at a time when the fifth switch and the sixth switch are open, and measuring a sixth voltage at the analog input of the second A/D converter;

closing the same one of the fourth switches and the sixth switch at a time when the fifth switch is open, and measuring a seventh voltage at the analog input of the second A/D converter; and closing the same one of the fourth switches and the fifth switch at a time when the sixth switch is open, and measuring an eighth voltage at the analog input of the second A/D converter.

26. The apparatus of claim 25 wherein the control means is further characterized in that the first, second, third, and fourth closings take place in the sequence set forth and the fifth, sixth, seventh, and eighth closings take place in the sequence set forth.

27. A method for use with respect to a first plurality of terminals and a second plurality of terminals, the method for use with respect to apparatus comprising a first analog to digital A/D converter having an analog input and a digital output, the first A/D converter measuring its input relative to a reference voltage VREF and to a ground, the apparatus further comprising a second analog to digital A/D converter having an analog input and a digital output, the second A/D converter measuring its input relative to the VREF and to the ground, the apparatus further comprising a first resistance, a plurality of second resistances, each of the second resistances associated with a respective one of the first plurality of terminals, and a third resistance, the first resistance connected between the analog input of the first A/D converter and the ground, the apparatus further comprising a fourth resistance, a plurality of fifth resistances, each of the fifth resistances associated with a respective one of the second plurality of terminals, and a sixth resistance, the fourth resistance connected between the analog input of the second A/D converter and the ground, the method comprising the steps of:

connecting the third resistance between the analog input of the first A/D converter and the VREF and measuring a first voltage at the analog input of the first A/D converter;

connecting one of the second resistances between the terminal and the analog input of the first A/D converter, and measuring a second voltage at the analog input of the first A/D converter;

connecting the same one of the second resistances between its respective terminal and the analog input of the first A/D converter and connecting the third resistance between the analog input of the first A/D converter and the ground, and measuring a third voltage at the analog input of the first A/D converter;

connecting the same one of the second resistances between its respective terminal and the analog input of the first A/D converter and connecting the third resistance between the analog input of the first A/D converter and the VREF, and measuring a fourth voltage at the analog input of the A/D converter;

connecting the sixth resistance between the analog input of the second A/D converter and the VREF, and measuring a fifth voltage at the analog input of the second A/D converter;

connecting one of the fifth resistances between its respective terminal and the analog input of the second A/D converter, and measuring a sixth voltage at the analog input of the second A/D converter;

connecting the same one of the second resistances between its respective terminal and the analog input of the second A/D converter and connecting the sixth resistance between the analog input of the second A/D converter and the ground, and measuring a seventh voltage at the analog input of the second A/D converter; and connecting the same one of the second resistances between its respective terminal and the analog input of the second A/D converter and connecting the sixth resistance between the analog input of the second A/D converter and the VREF, and measuring an eighth voltage at the analog input of the second A/D converter.

28. The method of claim 27 in which the first resistance is substantially equal in resistance to the third resistance and the fourth resistance is substantially equal in resistance to the sixth resistance.

29. The method of claim 27 wherein the first, second, third, and fourth connecting steps take place in the sequence set forth, and wherein the fifth, sixth, seventh, and eighth connecting steps take place in the sequence set forth.

30. The method of claim 27 further comprising the step, performed after the first, second, third, and fourth connecting steps, of evaluating a function of the first, second, third, and fourth voltages to yield a measured voltage at the respective terminal to the one of the second resistances, and further comprising the step, performed after the fifth, sixth, seventh and eighth connecting steps, of evaluating a function of the fifth, sixth, seventh, and eighth voltages to yield a measured voltage at the respective terminal to the one of the fifth resistances.

31. The method of claim 27 wherein the measuring of voltage at the analog input of the first A/D converter further comprises observing the voltage at several distinct times so as to evaluate whether the voltage is settled, and wherein the measuring of voltage at the analog input of the second A/D converter further comprises observing the voltage at several distinct times so as to evaluate whether the voltage is settled.

32. The method of claim 27 further comprising the step, performed after the first, second, third, and fourth connecting steps, of evaluating a function of the first, second, third, and fourth voltages to yield a measured value for the first resistance, the one of the second resistances, and the third resistance, and further comprising the step, performed after the fifth, sixth, seventh and eighth connecting steps, of evaluating a function of the fifth, sixth, seventh and eighth voltages to yield a measured value for the fourth resistance, the one of the fifth resistances, and the sixth resistance.

33. The method of claim 32 further comprising the step of comparing measured values for the first resistance, the one of the second resistances, and the third resistance at various times, whereby any large change in the first resistance or the one of the second resistances or the third resistance may be detected, and further comprising the step of comparing measured values for the fourth resistance, the one of the fifth resistances, and the sixth resistance at various times, whereby any large change in the fourth resistance or the one of the fifth resistances or the sixth resistance may be detected.

* * * * *